(12) United States Patent
Engerran

(10) Patent No.: US 7,867,312 B2
(45) Date of Patent: Jan. 11, 2011

(54) TRAP DEVICE

(75) Inventor: David Engerran, Arundel (GB)

(73) Assignee: Edwards Limited, Crawley, West Sussex (GB)

( * ) Notice: Subject to any disclaimer, the term of this patent is extended or adjusted under 35 U.S.C. 154(b) by 351 days.

(21) Appl. No.: 11/887,128

(22) PCT Filed: Mar. 7, 2006

(86) PCT No.: PCT/GB2006/000812

§ 371 (c)(1),
(2), (4) Date: Sep. 24, 2007

(87) PCT Pub. No.: WO2006/100429

PCT Pub. Date: Sep. 28, 2006

(65) Prior Publication Data

US 2009/0078123 A1     Mar. 26, 2009

(30) Foreign Application Priority Data

Mar. 24, 2005   (GB) ................. 0506089.2

(51) Int. Cl.
*B01D 46/00*     (2006.01)
(52) U.S. Cl. .................. 55/484; 55/318; 55/342; 55/342.2; 55/350.1; 55/418.1; 55/434.2; 55/434.4; 55/482.1; 55/DIG. 15; 96/400
(58) Field of Classification Search ............... 55/342, 55/342.2, 345, 346, 392.1, 418, 418.1, 422, 55/434.2, 434.3, 434.4, 437, 439, 482.1, 55/484, DIG. 15, 318, 482, 350.1; 96/399, 96/400, 121
See application file for complete search history.

(56) References Cited

U.S. PATENT DOCUMENTS 2,970,669 A * 2/1961 Bergson ................. 96/139

(Continued)

FOREIGN PATENT DOCUMENTS

DE         44 27 872 C1     2/1996

(Continued)

OTHER PUBLICATIONS

Rudowski Werner; abstract of DE 4427872 C1, entitled "Sepn. of a vaporised prod., esp. phthalic anhydride," GEA Luftkuehler Happel GmbH; Feb. 1, 1996.

(Continued)

*Primary Examiner*—Michael A Marcheschi
*Assistant Examiner*—Robert A Clemente

(57) ABSTRACT

A trap device (18) for removing species from a gas stream drawn from an enclosure by a vacuum pump is described, the device (18) comprising a casing having an inlet (16) for receiving the gas stream, an outlet (20) for exhausting the gas stream from the casing, and first and second chambers (136, 138) each for receiving the gas stream from the inlet and conveying the gas stream to the outlet; means (170, 174) for selectively diverting the gas stream from the inlet to a selected one of the chambers; a first plurality of cartridges (32) each being removably insertable into the casing to provide a plurality of flow passages for gas passing through the first chamber; and a second plurality of cartridges (132) each being removably insertable into the casing to provide a plurality of flow passages for gas passing through the second chamber, each flow passage extending between an inlet and an outlet of a respective cartridge, each cartridge housing means for removing species from the gas passing therethrough as solid material collecting within the cartridge.

27 Claims, 6 Drawing Sheets

U.S. PATENT DOCUMENTS

| | | | | |
|---|---|---|---|---|
| 5,820,641 | A * | 10/1998 | Gu et al. | 55/434.4 |
| 5,904,757 | A * | 5/1999 | Hayashi et al. | 96/416 |
| 5,944,990 | A | 8/1999 | Edens | |
| 6,156,107 | A * | 12/2000 | Hayashi et al. | 96/416 |
| 6,488,745 | B2 * | 12/2002 | Gu | 95/272 |
| 6,517,592 | B2 * | 2/2003 | Umotoy et al. | 55/315.2 |
| 6,547,844 | B2 * | 4/2003 | Rikyuu et al. | 55/315.1 |
| 6,835,221 | B2 * | 12/2004 | Rikyuu et al. | 55/315 |
| 6,908,499 | B2 * | 6/2005 | Lin et al. | 95/290 |
| 2003/0101699 | A1 | 6/2003 | Rikyuu et al. | |

FOREIGN PATENT DOCUMENTS

| | | |
|---|---|---|
| EP | 0 811 413 A2 | 12/1997 |
| JP | 56-152701 | 11/1981 |
| JP | 2001-131748 | 5/2001 |
| JP | 2002-118065 | 4/2002 |
| JP | 2004-101034 | 4/2004 |

OTHER PUBLICATIONS

Murakami Masashi; Patent Abstracts of Japan; abstract of JP 2001-131748, entitled "Method and Apparatus for Trapping," Tokyo Electron Ltd., May 15, 2001.

Yamauchi Atsunori; Patent Abstracts of Japan, abstract of JP 2002-118065, entitled Treatment Method of Semiconductor Gas and Filter Device, Mitsubishi Chemicals Corp; Apr. 19, 2002.

Shigematsu Akiyo, Imai Jiyuichi, Katou Tadao, Koike Takeshi; abstract of JP 56152701, entitled "Freezing Type Vaporized Gas Capturing Device,", Seitai Kagaku Kenkyusho KK; Taisei Kogyo Co Ltd; Nov. 26, 1981.

Nakamura Masatomo, Sato Kenjiro, Matsubara Hirokazu; abstract of JP 2004101034, entitled "Trap Device," Daido Steel Co Ltd; Apr. 2, 2004.

United Kingdom Search Report of Application No. GB 0506089.2; Date of mailing: Aug. 22, 2005; Claims searched: 1-31; Date of search: Aug. 19, 2005.

PCT Notification of Transmittal of the International Search Report and the Written Opinion of the International Searching Authority, or the Declaration of International Application No. PCT/GB2006/000812; Date of Mailing: Jun. 8, 2006.

PCT International Search Report of International Application No. PCT/GB2006/000812; Date of mailing of the International Search Report: Jun. 8, 2006.

PCT Written Opinion of the International Searching Authority of International Application No. PCT/GB2006/000812; Date of mailing: Jun. 8, 2006.

* cited by examiner

TRAP DEVICE

FIELD OF THE INVENTION

The present invention relates to a trap device, and in particular to a trap device for removing species from a gas stream drawn from an enclosure by a vacuum pump.

BACKGROUND OF THE INVENTION

During processes such as chemical vapour deposition processing, process gases are supplied to a process chamber to form a deposition layer on the surface of a substrate. As the residence time in the chamber of the process gas is relatively short, only a small proportion of the gas supplied to the chamber is consumed during the deposition process. The unconsumed process gas is subsequently pumped from the process chamber with one or more by-products from the process using one or more vacuum pumps.

The gas stream pumped from the process chamber can contain species that may cause premature failure of the pump. For example, some deposition process generate particulates which are exhaust from the process chamber with the unconsumed process gases. These deposits can accumulate within the pump and effectively fill the vacant running clearance between the rotor and stator elements of the pump, leading to a loss of pumping performance and ultimately pump failure.

As another example, many semiconductor processes use or generate solid, condensable or subliming compounds. For example, low-pressure chemical vapour deposition silicon nitride (LPCVD nitride) processes tend to use chlorosilanes (such as dichlorosilane or trichlorosilane) and ammonia to produce a uniform layer of silicon nitride to insulate a substrate. By-products of this process include complex ammonium-chloro-silicate salts, for example, ammonium hexachlorosilicate, which sublimes at 120° C. at atmospheric pressure. If the unconsumed process gas or by-product is condensable, sublimation on lower temperature surfaces can also result in the accumulation of powder or dust within the vacuum pump.

Furthermore, the gases exhaust from other deposition processes can contain unreacted species, such as tungsten hexafluorate or copper precursors used in the CVD of a tungsten or copper film on a substrate. The temperature and pressure within the pump can cause these unreacted species to react, forming solid material that coats the rotor and stator elements of the pump.

In view of this, there are a number of existing designs for trap devices for capturing species entrained within a gas steam. To capture particulates entrained within the gas stream, a trap device incorporating standard filter elements is located upstream from the vacuum pump so that the particulates become trapped within the filter elements. To capture condensable species contained within the gas stream, a cold trap device is typically provided at the outlet of a pump heated to a temperature above which the condensable species will pass through the pump without condensing within the pump. Such traps typically comprise a water-cooled coil located within a flow passage of the trap. As the gas stream flows through the flow passage, it contacts the coil, which cools the gas stream and causes low boiling point species within the gas stream to condense inside the trap.

A problem associated with each of these trap devices is that the device can become rapidly blocked by the collected solid material, causing a significant reduction in pump performance. As a result, the device must be periodically serviced to remove the solid material from within the trap. As the gas stream passes through the trap device as it flows towards, or away from, the vacuum pump, the gas flow must be temporarily stopped in order to allow the trap device to be emptied and cleaned, incurring down time and loss of production. Furthermore, the person cleaning the trap becomes exposed to the collected material, which, depending on the chemistry of the collected material may be particularly hazardous.

In addition, by heating the pump, the temperature of the gas stream may be heated to a temperature above which unreacted species within the gas stream are converted into solid material. For example, tungsten hexafluoride passing through a hot pump can form deposits of tungsten within the pump, which can lead to damage of the pumping mechanism.

It is an aim of at least the preferred embodiments of the invention to provide a trap device connectable to the inlet of a vacuum pump and which can enable rapid and safe servicing thereof.

SUMMARY OF THE INVENTION

In a first aspect, the present invention provides a trap device for removing species from a gas stream drawn from an enclosure by a vacuum pump, the device comprising a casing having an inlet for receiving the gas stream, an outlet for exhausting the gas stream from the casing, and first and second chambers each for receiving the gas stream from the inlet and conveying the gas stream to the outlet; means for selectively diverting the gas stream from the inlet to a selected one of the chambers; a first plurality of cartridges each being removably insertable into the casing to provide a plurality of flow passages for gas passing through the first chamber; and a second plurality of cartridges each being removably insertable into the casing to provide a plurality of flow passages for gas passing through the second chamber, each flow passage extending between an inlet and an outlet of a respective cartridge, each cartridge housing means for removing species from the gas passing therethrough as solid material collecting within the cartridge.

In a second aspect, the present invention provides a vacuum pumping arrangement comprising a vacuum pump having an inlet for receiving a gas stream and an outlet for exhausting a pumped gas stream, and a trap device as aforementioned having an outlet connected to the inlet of the vacuum pump.

In a third aspect the present invention provides a kit of parts comprising a casing having an inlet for receiving the gas stream, an outlet for exhausting the gas stream from the casing, first and second chambers each for receiving the gas stream from the inlet and conveying the gas stream to the outlet, and means for selectively diverting the gas stream from the inlet to a selected one of the chambers; and a plurality of sets of cartridges for removing species from the gas stream, each set of cartridges comprising a first subset of cartridges each being removably insertable into the casing to provide a plurality of flow passages for gas passing through the first chamber; and a second subset of cartridges each being removably insertable into the casing to provide a plurality of flow passages for gas passing through the second chamber, each flow passage extending between an inlet and an outlet of a respective cartridge, wherein each set of cartridges has a respective different mechanism for removing species from the gas stream as solid material collecting within the cartridge.

As opposed to providing a plurality of sets of cartridges, a plurality of different sets of mechanisms for removing species from the gas stream may be provided, each mechanism being provided as an insert removably insertable into a cartridge. Therefore, in a fourth aspect the present invention provides a kit of parts comprising a casing having an inlet for receiving the gas stream, an outlet for exhausting the gas stream from the casing, first and second chambers each for receiving the gas stream from the inlet and conveying the gas stream to the outlet, and means for selectively diverting the gas stream from the inlet to a selected one of the chambers; a first plurality of cartridges each being removably insertable into the casing to provide a plurality of flow passages for gas passing through the first chamber; a second plurality of cartridges each being removably insertable into the casing to provide a plurality of flow passages for gas passing through the second chamber, each flow passage extending between an inlet and an outlet of a respective cartridge, and a plurality of sets of inserts for the cartridges, each insert comprising means for removing species from the gas stream, wherein each set of inserts removes species from the gas stream by a respective different mechanism.

Features described above in relation to first and second aspects of the invention are equally applicable to the third and fourth aspects of the invention, and vice versa.

BRIEF DESCRIPTION OF THE DRAWINGS

Preferred features of the present invention will now be described with reference to the accompanying drawing, in which.

DETAILED DESCRIPTION OF THE INVENTION

Figure 1:
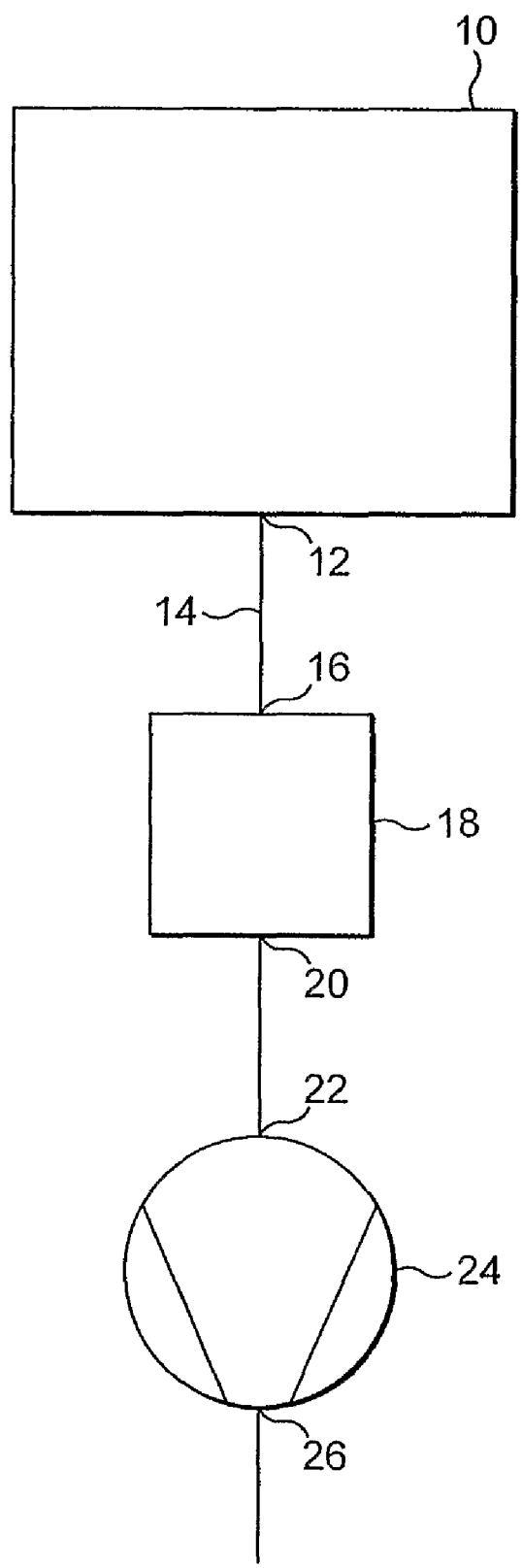
FIG. 1 illustrates schematically an example of a processing system.

With reference to FIG. 1, a processing system, for example for semiconductors or flat panel display devices, comprises a process chamber 10 having at least one inlet for receiving one or more process gases, and an outlet 12 for exhausting unconsumed process gases containing by-products from the process conducted within the process chamber 10. The outlet 12 from the process chamber 10 is connected by conduit 14 to the inlet 16 of a trap device 18 for removing species from the gas stream exhaust from the process chamber 10. The trap 18 has an outlet 20 connected to the inlet 22 of a vacuum pump 24 for drawing the gas stream from the process chamber 10. The vacuum pump 24 has an exhaust 26 connected to the inlet of a backing pump or to the inlet of a scrubbing device as required.

Figure 2:
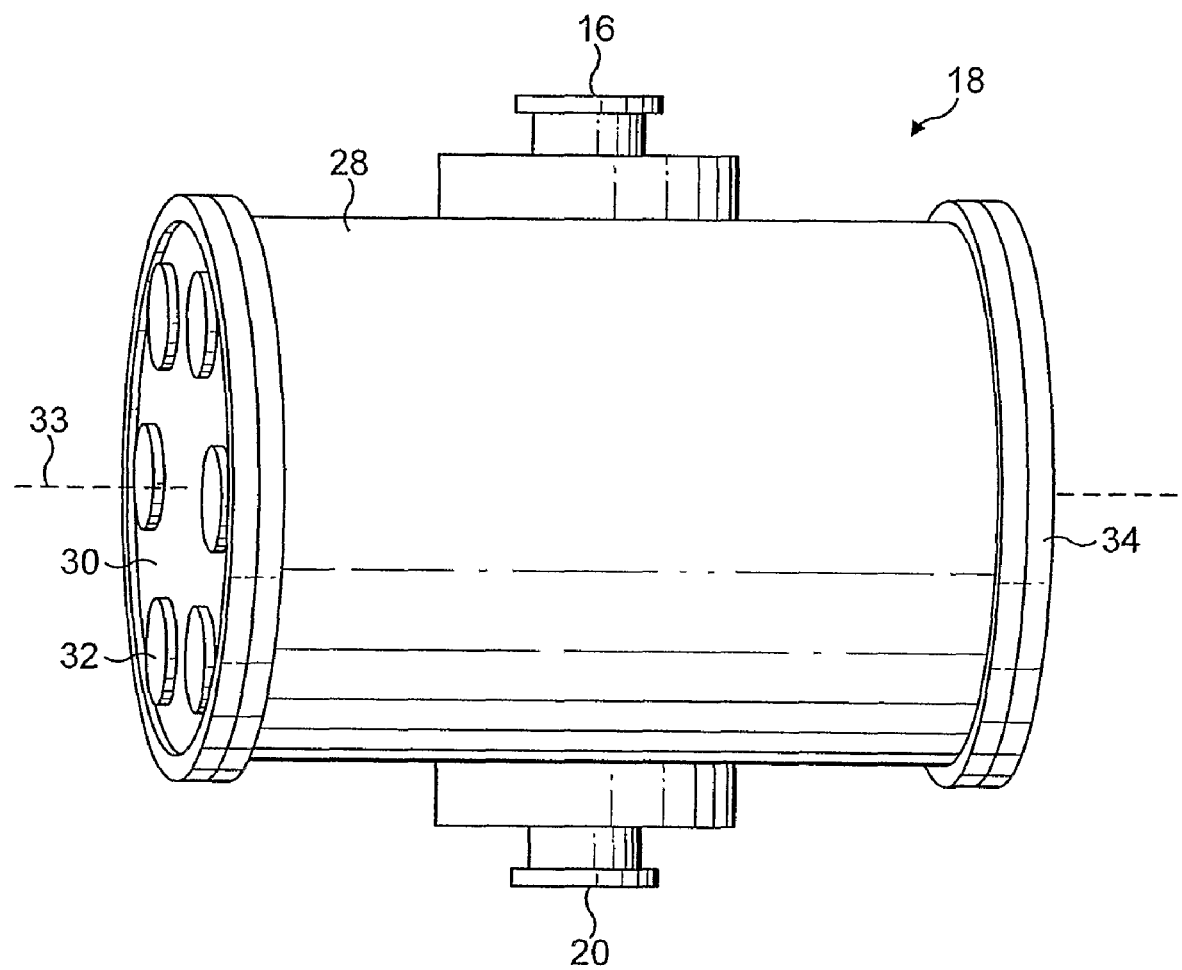
FIG. 2 is a perspective view of a trap device suitable for use in the system of FIG. 1.
Figure 3:
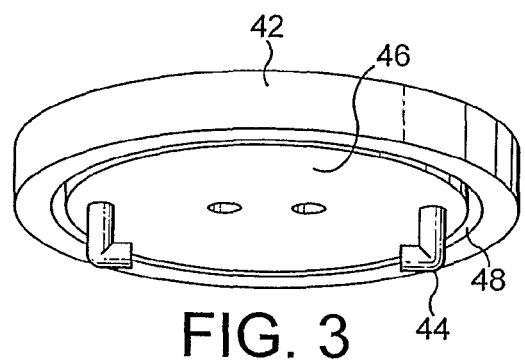
FIG. 3 is a perspective view of a lid of one of the cartridges of the trap of FIG. 2.

FIG. 2 is a perspective view of an example of the trap 18. The trap 18 comprises a cylindrical casing 28 having a flanged inlet 16 for connection to the conduit 14, and a flanged outlet 20 located substantially opposite to the inlet 16 for connection to the inlet 22 of the pump 24. The casing 28 has a first sidewall 30 defining a first plurality of apertures each for receiving one of a first plurality of cartridge 32 removably insertable into the casing 28 for removing one or more species from a gas stream passing through the trap 18. In the illustrated embodiment, the first sidewall 30 has six circular apertures equidistantly spaced about the longitudinal axis 33 of the casing 28. However, the number of apertures, the size of the apertures and/or the shape of the apertures, and thus the number, size and/or shape of cartridges 32 insertable into the casing 28, can be altered depending on, for example, the size of the pump 24 and the gases that will be contained within the gas stream entering the trap 18. The opposite sidewall 34 similarly defines a second plurality of apertures each for receiving one of a second plurality of cartridges (not shown in FIG. 2) removably insertable into the casing 28 for removing one or more species from a gas stream passing through the trap 18.

Each cartridge 32 has a lid 42 by means of which the cartridge 32 is mounted in the casing 28. The lid is shown in more detail in FIG. 4. Each cartridge 32 is secured to a respective lid 42 by any suitable means, for example, a screw thread or, as illustrated, by means of resilient L-shaped fingers 44 provided on the lower (as shown) surface 46 of the lid 42 and which locate within one or more corresponding recesses or apertures provided in the cartridge 32. Each lid 42 has a diameter that is greater than that of the apertures in the casing so that when a cartridge 32 is fully inserted into the casing, the cartridge 32 is suspended within the casing 28 by its lid 42. The lid 42 of the cartridge 32 can then be secured to the sidewall 30, 34 of the casing 28 by any suitable means, such as clamps or the like. A groove 48 may be formed on the lower surface 46 of the lid 42 to receive an O-ring seal (not shown) to form a gas-tight seal with the external surface of the sidewall 30, 34 when the lid 42 is secured to the casing 28.

Due to the modular nature of the trap 18, the trap 18 may be provided with different sets of cartridges 32, each set including a different respective mechanism for removing species from the gas stream. This can enable the trap 18 to be easily customised according to the nature of the gas stream drawn from the enclosure by the vacuum pump 24. FIGS. 4 to 8 illustrate some embodiments of cartridges and/or mechanisms for removing species from the gas stream passing through the trap 18.

Figure 4:
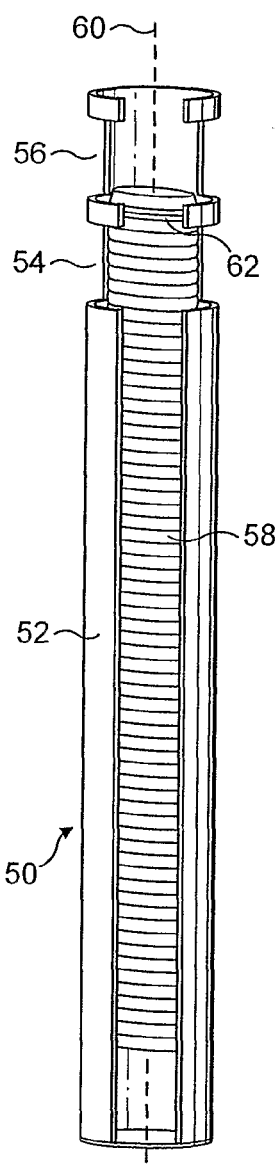
FIG. 4 is a perspective view of a first embodiment of a cartridge suitable for use in the trap of FIG. 2, with part of the casing removed to reveal the mechanism for removing species from a gas stream flowing through the cartridge.

With reference first to FIG. 4, each cartridge 50 comprises an elongate cartridge casing or body 52 having at least one inlet 54 and at least one outlet 56. In this embodiment, the body 52 houses a mechanism for cooling the gas stream to condense condensable species within the gas stream to form a solid condensate within the body 52 of the cartridge 50. This mechanism is provided by a helical duct 58 extending along the length of the cartridge 50 and about the longitudinal axis 60 of the cartridge 50. The ends of the helical duct 58 are connected to piping (not shown) extending through the lid 42 of the cartridge 50, for supplying to the helical duct 58 a coolant for cooling the internal and external surfaces of the helical duct 58. The cartridge 50 also includes a baffle 62 in the form of a ring located about the helical duct 58 and axially between the inlet 54 and the outlet 56. In use, the baffle 62 directs gas entering the cartridge 50 downwards (as illustrated) between the external surface of the helical duct 58 and the interior surface of the body 52 of the cartridge 50. At the bottom of the cartridge 50, the gas changes direction and passes upwards (as illustrated) along the inside of the helical duct 58. As the gas is conveyed through the cartridge 50, it is cooled, in turn, by the cold external and internal surfaces of the helical duct 58. Condensable species within the gas are condensed from the gas stream as solid material forming on the surfaces of the helical duct 58. At the top of the cartridge 50, the gas is exhaust from the outlet 56.

Figure 5:
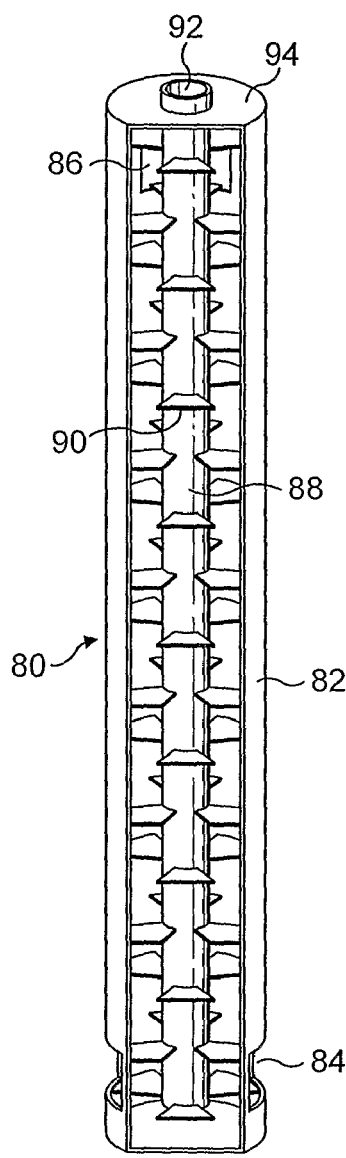
FIG. 5 is a perspective view of a second embodiment of a cartridge suitable for use in the trap of FIG. 2, with part of the casing removed to reveal the mechanism for removing species from a gas stream flowing through the cartridge.

In the embodiment shown in FIG. 5, the cartridge 80 comprises an elongate body 82 having at least one inlet 84 at one end thereof and at least one outlet 86 at the other end thereof. This cartridge 80 includes a mechanism for heating the gas passing through the cartridge 80 to convert unreacted species in the gas stream, such as tungsten hexafluoride or copper precursors used in the CVD of a copper film on a substrate, into solid material. This mechanism comprises a heated duct 88 extending axially along the length of the cartridge 80, the duct 88 having a plurality of metallic fins 90 mounted thereon and substantially orthogonal thereto to provide heated baffles for heating the gas passing through the cartridge 80. The duct 88 may be heated by any suitable means, for example, by an electrical heater located within the duct 88. An aperture 92 located in the lid 94 of the cartridge 80 enables the heater to be connected to an external power source. In use, the elevated temperature within the cartridge 80 promotes the conversion of unreacted species within the gas stream passing through the cartridge 80 into solid material that forms over the duct 88 and fins 90.

Figure 6:
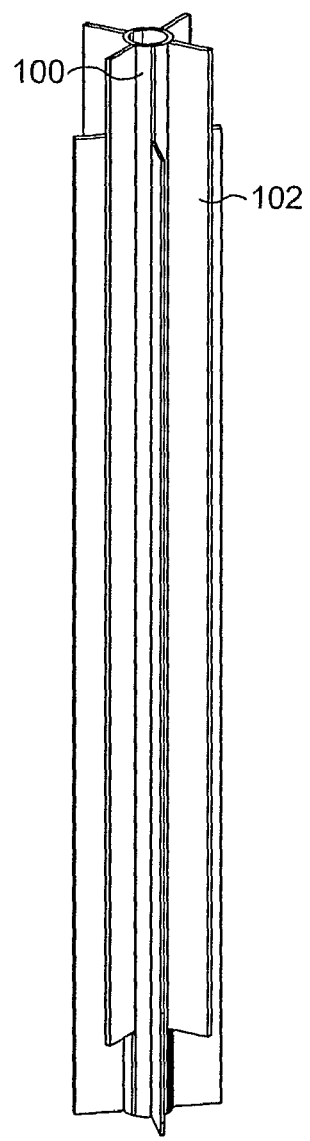
FIG. 6 is a perspective view of another mechanism for removing species from a gas stream flowing through the cartridge.

FIG. 6 illustrates an alternative removal mechanism suitable for use within the cartridge 80 of FIG. 5. This mechanism comprises a duct 100 having a plurality of metal fins 102 extending radially therefrom. Similar to the embodiment of FIG. 5, the duct 100 can receive a heater for heating the fins 102 and thus the gas passing through the cartridge 80, or, similar to the helical duct 58 of the embodiment of FIG. 4, can receive a flow of coolant for cooling the fins 102 and thus the gas passing through the cartridge 80.

Figure 7:
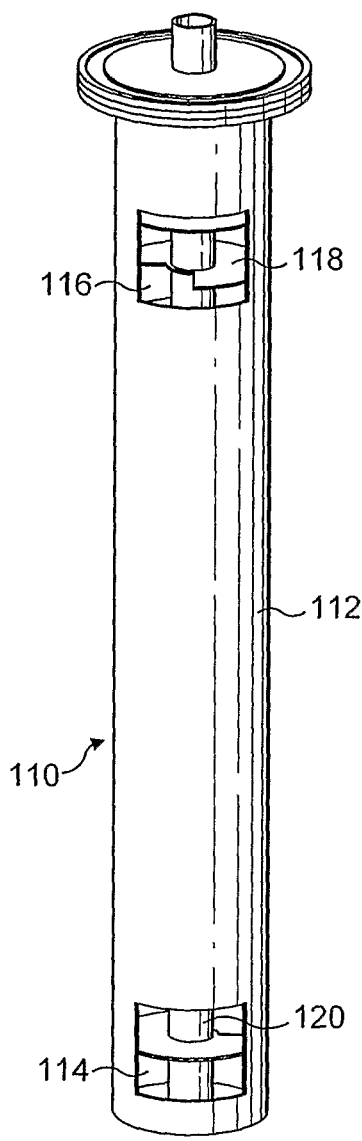
FIG. 7 is a perspective view of a third embodiment of a cartridge suitable for use in the trap of FIG. 2.
Figure 8:
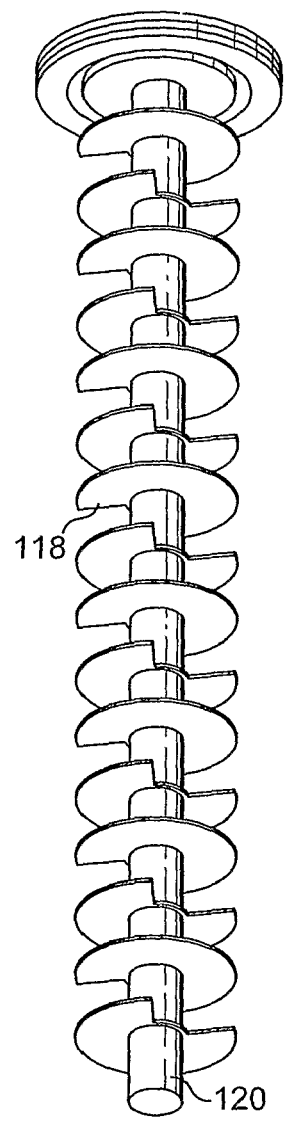
FIG. 8 is a perspective view of the trapping mechanism of the cartridge of FIG. 7.

FIG. 7 illustrates schematically a cartridge 110 comprising an elongate body 112 having at least one inlet 114 at one end thereof and at least one outlet 116 at the other end thereof. This cartridge 110 includes a filter mechanism for capturing particulates contained in the gas stream passing through the cartridge 110. With reference to FIG. 8, in this example, the cartridge 110 comprises a plurality of filter elements 118 mounted on a shaft 120 extending along the length of the cartridge 110. The filter elements 118 may be formed from any suitable material, for example porous stainless steel. The filter elements 118 are shaped and mounted on the shaft 120 so as to define a tortuous flow passage between the opposing surfaces of adjacent filter elements 118 for the gas stream entering the cartridge 110. As the gas stream passes along the flow passage within the cartridge 110, it is forced to continually change direction by the filter elements 118 as it flows towards the outlet 116. Particulates within the gas stream are thrown outwardly from the gas stream as it changes direction, whereupon they become trapped by the filter elements 118 and unable to return to the gas stream. During use, the filter elements 118 will become increasingly blocked from the inlet 114 of the cartridge 110 to the outlet 116 of the cartridge 110. Even when the filter elements 118 has become fully blocked, the gas passage remains unrestricted, and so there is no loss of performance of the vacuum pump 24. The spacing between the filter elements 118 may be adjusted to vary the pitch and/or number of filter elements 118 within the cartridge 110 so as to vary the degree of filtering performed by the cartridge 110, and thus enable the cartridges 110 to be customised according to the nature of the process gas flows and the required service intervals. The fins 90 in the embodiment illustrated in FIG. 5 may be similarly adjusted.

The trap device 18 can therefore be provided with a plurality of sets of cartridges, each set housing a respective different mechanism for removing species from a gas stream. For example, the trap device 18 may be provided with four sets of cartridges, the sets comprising, in turn, a mechanism for cooling the gas stream, a mechanism for heating the gas stream, a relatively coarse set of filter elements and a relatively fine set of filter elements, respectively. For the trap device illustrated in FIG. 2, each set would comprise at least twelve cartridges; a first subset of six cartridges for insertion into the first plurality of apertures, and a second subset of six cartridges for insertion into the second plurality of apertures.

Figure 9:
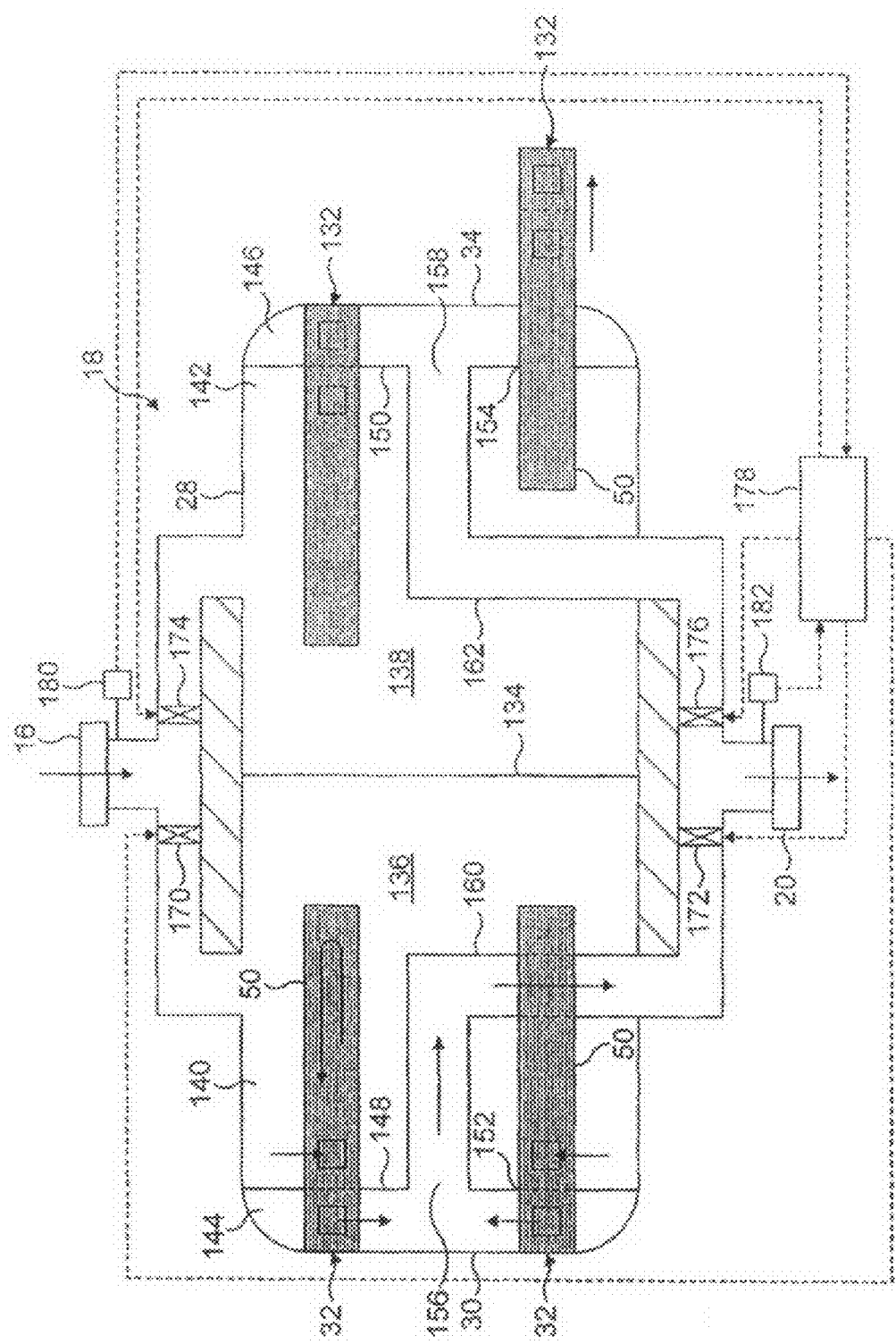
FIG. 9 is a schematic cross-sectional view of the trap of FIG. 2.

FIG. 9 is a cross-sectional view of the trap 18 having a first plurality of cartridges 32 inserted into the first plurality of apertures in the first sidewall 30 of the casing 28, and a second plurality of cartridge 132 inserted into the second plurality of apertures in the second sidewall 34 of the casing 28. In FIG. 9, the pluralities of cartridges 32,132 are provided by cartridges 50 for removing condensable species from the gas stream passing through the trap 18, although any of the other embodiments of cartridges described above may be used.

The casing 28 includes a plate 134 arranged substantially orthogonal to the longitudinal axis of the casing 28 that internally divides the casing 28 into a first chamber 136 and a second chamber 138. Each of the first and second chambers 136, 138 is in turn divided by plates 148, 150 located within the casing 28 into a first plenum chamber 140, 142 respectively for receiving gas from the inlet 16 and a second plenum chamber 144, 146 respectively from which gas flows towards the outlet 20. Each plate 148, 150 includes a series of first apertures 152, 154 respectively which are arranged substantially co-axial with the apertures in the adjacent sidewall 30, 34 to receive the cartridges 32, 132, and a second, central aperture 156, 158 respectively from which gas is exhaust from the second plenum chamber 144, 146 to conduits 160, 162 respectively, which convey the gas to the outlet 20 of the casing 28. The plates 148, 150 are positioned relative to the sidewalls 30, 34 such that when a cartridge 50 is fully inserted into the casing 28, the inlet 54 is in fluid communication with one of the first plenum chambers 140, 142 only, and the outlet 56 is in fluid communication with one of the second plenum chambers 144, 146 only.

The trap device 18 further includes a first valve arrangement comprising an inlet valve 170 and an outlet valve 172 for selectively isolating the first chamber 136 from the inlet 16 and the outlet 20 of the casing 28, and a second valve arrangement comprising an inlet valve 174 and an outlet valve 176 for selectively isolating the second chamber 138 from the inlet 16 and the outlet 20 of the casing 28. Opening and closing of these valves is controlled by signals output from a controller 178. A first pressure sensor 180 outputs to the controller 178 signals indicative of the pressure at the inlet 16 of the casing 28, and a second pressure sensor 182 outputs to the controller 178 signals indicative of the pressure at the outlet 20 of the casing 28.

In use, one of the valve arrangements is initially opened and the other valve arrangements is closed so that the gas stream entering the trap device 18 is conveyed into a selected one of the first and second chambers 136, 138. FIG. 9 illustrates the trap 18 when the inlet valve 174 and outlet valve 176 of the second valve arrangement are closed. The gas stream passes through the open inlet valve 170 and enters the first plenum chamber 140, from which it passes into the first plurality of cartridges 32 through the inlets 54 thereof. As the gas passes through the cartridges, condensable species within the gas are condensed from the gas stream as solid material forming on the surfaces of the helical duct 58. The gas is exhaust from the outlet 56 into the second plenum chamber 144. The gas stream then passes through the second aperture 156 into the conduit 160, which conveys the gas stream to the outlet 20 of the trap 18 through the open outlet valve 172.

While the gas stream is flowing through the first chamber 136, servicing of the second plurality of cartridges 132, which are isolated from the gas stream, can be performed without disrupting the processing within the process chamber 10. Each cartridge can be easily removed from the casing 28 by releasing the clamps hold the lid 42 of the cartridge to the sidewall 34 of the casing 28, and lifting the cartridge from the casing 28. As the solid condensate from the gas stream is retained within the body 52 of the cartridge, the user's exposure to this solid material is minimised. The replaced cartridge 32 can then be taken to a suitable place for cleaning of the helical duct 58 and/or replacement of the helical duct. Part of the body 52 of the cartridge 32 may be removable to provide user access to the internal and external surfaces of the helical duct 58. Following this servicing, the cartridge can then be inserted into the casing 28.

As the gas is conveyed through the first chamber 136, the controller 178 monitors the pressure difference between the inlet 16 and the outlet 20 of the casing from the signals received from the sensors 180, 182. When the pressure differences reaches a predetermined value indicative of blocking of one or more of the first plurality of cartridges 32, the controller 178 outputs signals to the valve arrangements to close the inlet valve 170 and outlet valve 172 to isolate the first chamber 136 from the gas stream, and to open the inlet valve 176 and outlet 178 so that the gas stream now flows through the second chamber 138 and second plurality of—now cleaned—cartridges 132. The controller 178 is preferably configured to sequence the opening and the closing of the valves so that no pressure spikes are seen by the process chamber 10 during this switching of the chambers within the casing 28, and to ensure that the second chamber 138 is pumped down to the same pressure as the first chamber 136 before the process chamber 10 is exposed to the second chamber 138. The first plurality of cartridges 32 can now be serviced without shutting off the gas stream. Alternatively, the controller 178 may control a pressure balance valve to gradually equalise the pressures between the first and second chambers 136, 138 following replacement of the second plurality of cartridges 132.

By dividing the casing into two chambers and providing means for selectively diverting the gas stream from the inlet to a selected one of the chambers, this can enable the gas stream to be passed through, for example, the first chamber to enable the species to be removed from the gas stream by the first plurality of cartridges while the second chamber is isolated from the gas stream to enable the second plurality of cartridges to removed for cleaning or replacement. When the first plurality of cartridges require cleaning, the gas stream can then be directed through the second chamber and the (now cleaned) second plurality of cartridges. This can enable servicing of the trap device to be performed without shutting the process tool down to shut off the gas stream, thereby avoiding any downtime, and also provides maximum protection to the pump, as the chamber can be switched before the plurality of cartridges currently being exposed to the gas stream become completely blocked.

By providing a plurality of cartridges that can be readily removed from each chamber of the casing of the trap for cleaning, the speed and ease at which the trap is periodically serviced can be markedly improved. For example, when one or more of the cartridges requires cleaning, that cartridge can be readily removed from the trap and replaced by a fresh cartridge. The replaced cartridge can then be taken to a suitable place for cleaning. In addition, as particulates are retained within the cartridge, the level of user exposure to the particulates during servicing is minimised. Furthermore, due to the use of a plurality of removal means, each within a respective cartridge, the surface area of the removal means can be maximised.

In preferred embodiments, each cartridge comprises means for condensing species from the gas passing therethrough as a condensate collecting within the cartridge. The condensing means preferably comprises means for cooling the gas passing through the cartridge to a temperature at or below which a condensable species within the gas condenses into a condensate. For example, each cartridge may comprise a duct for conveying within the cartridge a flow of coolant for cooling the gas passing through the cartridge. The coolant preferably comprises a liquid coolant, preferably water, which may be refrigerated if desired. By providing a cold trap at the inlet of the pump, there is no requirement to heat the pump to prevent the condensation of the condensable species within the pump, and therefore there is no risk of promoting within the pump the conversion of other unreacted species of the gas stream to solid material.

In one embodiment, the condensing means comprises a plurality of cooling fins in thermal contact with the duct and arranged such that gas flowing through the cartridge passes over the cooling fins. In another embodiment, the duct is a helical duct, the flow passage comprising a first portion extending along and about the duct, and a second portion extending along the longitudinal axis of the duct.

Each cartridge may comprise at least one baffle for directing gas entering the cartridge towards one of the first and second portions of the flow passage. The baffle is preferably in the form of a ring extending about the duct to separate the cartridge into first and second cartridge chambers. Gas enters the first cartridge chamber from the cartridge inlet, passes along the outside of the duct, and then changes direction at the end of the cartridge and passes along the inside of the helical duct into the second cartridge chamber, from which the gas leaves the cartridge through the outlet thereof.

Alternatively, no baffle plate may be provided within the cartridge, with the cartridge inlet being located towards one end of the cartridge and the cartridge outlet being located towards the other end of the cartridge. In this case, gas enters the cartridge from the cartridge inlet, passes both along the outside of the duct and along the inside of the duct, and leaves the cartridge through the outlet thereof.

In either case, due to the contact of the gas with both the internal and the external surfaces of the helical duct, the exposure of the gas to the cold surfaces of the helical duct can be maximised. To facilitate cleaning of the duct, a metallic sleeve may be placed over the outside of the duct so that the condensate forms on the outer surface of the sleeve rather than on the outer surface of the helical duct.

A secondary cooling coil may be fitted to the base of the casing to reduce the temperature of the gas stream entering the trap.

A different type of mechanism for removing species from the gas stream may be employed within the cartridges. For example, in another preferred embodiment each cartridge comprises means for heating gas passing through the cartridge to a temperature at or above which an unreacted species within the gas is converted into solid material. The heating means may conveniently comprise a heater and a plurality of fins arranged in thermal contact with the heater and such that gas flowing through the cartridge passes over the fins. For example, the heating means may comprise a duct housing the heater, the fins being mounted on the duct. This duct preferably extends along the length of the cartridge. The fins may be arranged in the form of baffles to define a tortuous flow passage for gas flowing though the cartridge, or in any other arrangement.

In yet another preferred embodiment, each cartridge comprises at least one filter element for removing particulates from the gas passing through the cartridge. Said at least one filter element preferably defines a tortuous flow passage for a gas stream passing through the device. By arranging the filter element(s) to define a tortuous passage, for example, a spiral or sinusoidal passage, for a gas stream passing through the trap, the gas stream is forced to repeatedly change direction as it passes from the inlet towards the outlet of the casing. Each time the gas stream changes direction, particulates within the gas stream are thrown outwards from the gas stream and trapped by a filter element. The filter element(s) thus become progressively blocked from the inlet to the outlet of the cartridge. In the event that the filter element(s) become completely blocked, the gas stream is still able to flow through the cartridge to the outlet of the casing, albeit without any filtering of the particulates contained within, and so that pumping performance is not lost.

Each cartridge may house a plurality of filter elements spaced along the longitudinal axis thereof and defining therebetween said flow passage.

An advantage provided by the present invention is that more aggressive filter elements can be used within the first and second pluralities of cartridges. Normally, such filter elements become blocked within a few weeks, thus requiring regular maintenance by service personnel, which in turn requires the process tool to be shut down regularly. By enabling the gas stream to be toggled between the first and second chambers, this frequency of maintenance can be performed without shutting down the process tool.

To facilitate cleaning, at least part of the cartridge is preferably detachable to expose at least part of the removal means. For example, the body of the first chamber of the cartridge may be removable from the remainder of the cartridge to provide access to the removal means.

The casing preferably comprises at least one baffle for directing gas entering a chamber from the inlet of the casing and into the cartridges. In the preferred embodiment, the baffle is in the form of a plate defining a plurality of openings each for receiving a respective cartridge. The plate preferably separates the chamber into a first plenum chamber, which is in fluid communication with the inlet of the casing and the inlets of the cartridges, and a second plenum chamber, which is in fluid communication with the outlets of the cartridges and the outlet of the casing.

The means for selectively diverting the gas stream from the inlet to a selected one of the chambers preferably comprises a plurality of valves located within the casing, and control means for selectively opening and closing the valves.

To provide an indication of that a plurality of cartridges requires servicing, and therefore that the gas stream should be switched between the first and second chambers, the device preferably comprises means for detecting a pressure within the casing, the control means being configured to operate the valves to divert the gas stream from one of the chambers to the other of the chambers in dependence on signals received from the detecting means. For example, the detecting means may be configured to detect the pressure at the inlet of the casing and the pressure at the outlet of the casing, with the control means being configured to operate the valves in dependence on a predetermined relationship between the signals received from the detecting means. An alert may then be generated to notify a user that one of the pluralities of cartridges requires cleaning.

Due to the modular nature of the trap device, different types of cartridges may be inserted into the casing depending on the nature of the gas stream passing through the cartridge. For example, whilst for one gas stream it would be desirable to use cartridges housing filter elements for removing particulates from the gas stream, for another gas stream it would be more desirable to use cartridges housing means for condensing condensable species within the gas stream. The trap may therefore be supplied with a single casing and different sets of cartridges, each set having its own respective mechanism for removing species from the gas stream, so that the trap may be rapidly and easily customised to suit the gas stream passing therethrough.

While the foregoing description and drawings represent the preferred embodiments of the present invention, it will be apparent to those skilled in the art that various changes and modifications may be made therein without departing from the true spirit and scope of the present invention.

I claim:

1. A trap device for removing species from a gas stream drawn from an enclosure by a vacuum pump, the device comprising:

a casing having an inlet for receiving the gas stream, an outlet for exhausting the gas stream from the casing, and first and second chambers each for receiving the gas stream from the inlet and conveying the gas stream to the outlet;

means for selectively diverting the gas stream from the inlet to a selected one of the chambers;

a first plurality of cartridges each being removably insertable into the casing to provide a plurality of flow passages for gas passing through the first chamber; and a second plurality of cartridges each being removably insertable into the casing to provide a plurality of flow passages for gas passing through the second chamber, each flow passage extending between an inlet and an outlet of a respective cartridge, each cartridge housing a removal means to remove species from the gas passing therethrough as solid material collecting within the cartridge, wherein each chamber comprises baffle means for directing gas entering that chamber into the inlets of the cartridges located therein, wherein the inlet and the outlet of each cartridge are positioned such that, when the cartridge is fully inserted into the chamber, the inlet and the outlet of the cartridge are located on opposite sides of the baffle means, wherein within the chamber the baffle means separates a first plenum chamber, which is in fluid communication with the inlet of the casing and the inlets of the cartridges, from a second plenum chamber which is in fluid communication with the outlets of the cartridges and the outlet of the casing.

2. The trap device according to claim 1 wherein the removal means of at least one of the first and second plurality of cartridges comprises means for condensing species from the gas passing through the cartridge as a condensate collecting within the cartridge.

3. The trap device according to claim 2 wherein the condensing means comprises cooling means for cooling the gas passing through the cartridge to a temperature at or below which a condensable species within the gas condenses into a condensate.

4. The trap device according to claim 2 wherein the condensing means comprises a duct for conveying within the cartridge a flow of coolant for cooling the gas passing through the cartridge.

5. The trap device according to claim 4 wherein the coolant comprises a liquid coolant.

6. The trap device according to claim 4 wherein the condensing means comprises a plurality of cooling fins in thermal contact with the duct and arranged such that gas flowing through the cartridge passes over the cooling fins.

7. The trap device according to claim 4 wherein the condensing means comprises a helical duct, the flow passage comprising a first portion extending along and about the duct, and a second portion extending along the longitudinal axis of the duct.

8. The trap device according to claim 7 wherein each cartridge comprises baffle means for directing gas entering the cartridge towards one of the first and second portions of the flow passage.

9. The trap device according to claim 1 wherein the removal means of at least one of the plurality of cartridges comprises at least one filter element for removing particulates from the gas passing through the cartridge.

10. The trap device according to claim 9 wherein said at least one filter element defines a tortuous flow passage for a gas stream passing through the device.

11. The trap device according to claim 10 wherein said at least one filter element defines a sinusoidal flow passage for the gas stream.

12. The trap device according to claim 9 wherein each cartridge houses a plurality of filter elements spaced along the longitudinal axis thereof and defining therebetween said flow passage.

13. The trap device according to claim 1 wherein the removal means of at least one of the first and second plurality of cartridges comprises means for heating gas passing through the cartridge to a temperature at or above which an unreacted species within the gas is converted into solid material.

14. The trap device according to claim 13 wherein the heating means comprises a heater and a plurality of fins arranged in thermal contact with the heater and such that gas flowing through the cartridge passes over the fins.

15. The trap device according to claim 14 wherein the heating means comprises a duct housing the heater, the fins being mounted on the duct.

16. The trap device according to claim 15 wherein the duct extends along the length of the cartridge.

17. The trap device according to claim 15 wherein the fins are arranged to define a tortuous flow passage for gas flowing though the cartridge.

18. The trap device according to claim 1 wherein the removal means of the first plurality of cartridges is the same as the removal means of the second plurality of cartridges.

19. The trap device according to claim 1 wherein at least part of each cartridge is detachable.

20. The trap device according to claim 1 wherein each chamber is configured to receive at least three cartridges.

21. The trap device according to claim 1 wherein each plurality of cartridges are arranged about the longitudinal axis of the casing.

22. The trap device according to claim 21 wherein the cartridges are substantially equidistantly spaced about the longitudinal axis of the casing.

23. The trap device according to claim 1 wherein the means for selectively diverting the gas stream from the inlet to a selected one of the chambers comprises a plurality of valves located within the casing, and control means for selectively opening and closing the valves.

24. The trap device according to claim 23 comprising means for detecting a pressure within the casing, the control means being configured to operate the valves to divert the gas stream from one of the chambers to the other of the chambers in dependence on signals received from the detecting means.

25. The trap device according to claim 24, wherein the detecting means is configured to detect the pressure at the inlet of the casing and the pressure at the outlet of the casing, the control means being configured to operate the valves in dependence on a predetermined relationship between the signals received from the detecting means.

26. A kit of parts comprising:
a casing having an inlet for receiving the gas stream, an outlet for exhausting the gas stream from the casing, first and second chambers each for receiving the gas stream from the inlet and conveying the gas stream to the outlet, and means for selectively diverting the gas stream from the inlet to a selected one of the chambers; and
a plurality of sets of cartridges for removing species from the gas stream, each set of cartridges comprising
a first subset of cartridges each being removably insertable into the casing to provide a plurality of flow passages for gas passing through the first chamber; and
a second subset of cartridges each being removably insertable into the casing to provide a plurality of flow passages for gas passing through the second chamber, each flow passage extending between an inlet and an outlet of a respective cartridge, wherein each set of cartridges has a respective different mechanism for removing species from the gas stream as solid material collecting within the cartridge,
wherein each of the cartridges forms an independent flow passage in a manner that gas emitting from the outlet of one of the cartridges does not enter the rest of the cartridges through their respective inlets.

27. A kit of parts comprising:
a casing having an inlet for receiving the gas stream, an outlet for exhausting the gas stream from the casing, first and second chambers each for receiving the gas stream from the inlet and conveying the gas stream to the outlet, and means for selectively diverting the gas stream from the inlet to a selected one of the chambers;
a first plurality of cartridges each being removably insertable into the casing to provide a plurality of flow passages for gas passing through the first chamber;
a second plurality of cartridges each being removably insertable into the casing to provide a plurality of flow passages for gas passing through the second chamber, each flow passage extending between an inlet and an outlet of a respective cartridge; and
a plurality of sets of inserts for the cartridges, each insert comprising means for removing species from the gas stream, wherein each set of inserts removes species from the gas stream by a respective different mechanism,
wherein each of the cartridges forms an independent flow passage in a manner that gas emitting from the outlet of one of the cartridges does not enter the rest of the cartridges through their respective inlets.

* * * * *